United States Patent [19]
Ueno

[11] Patent Number: 4,800,529
[45] Date of Patent: Jan. 24, 1989

[54] SEMICONDUCTIVE MEMORY DEVICE WITH CURRENT CONTROL AND COMPARISON MEANS TO REDUCE POWER CONSUMPTION AND INCREASE OPERATING SPEED

[75] Inventor: Kouji Ueno, Inagi, Japan

[73] Assignee: Fujitsu Limited, Kawasaki, Japan

[21] Appl. No.: 26,899

[22] Filed: Mar. 17, 1987

[30] Foreign Application Priority Data

Mar. 17, 1986 [JP] Japan .................................. 61-058714

[51] Int. Cl.[4] .................................................. G11C 7/00
[52] U.S. Cl. .................................... 365/189; 365/104; 365/105; 365/208
[58] Field of Search ................... 365/189, 230, 96, 94, 365/104, 105, 238, 208, 226

[56] References Cited

U.S. PATENT DOCUMENTS

| 4,162,540 | 7/1979 | Ando | 365/194 X |
| 4,171,538 | 10/1979 | Sheller | 364/900 X |
| 4,195,358 | 3/1980 | Yuen | 365/230 X |
| 4,319,341 | 3/1982 | Fukushima et al. | 365/94 X |
| 4,441,167 | 4/1984 | Principi | 365/96 |
| 4,672,576 | 6/1987 | Davis | 365/96 |
| 4,713,797 | 12/1987 | Morton et al. | 365/208 X |

FOREIGN PATENT DOCUMENTS

| 0056240 | 1/1982 | European Pat. Off. | |
| 0085727 | 2/1982 | European Pat. Off. | |
| 0117282 | 10/1983 | European Pat. Off. | |
| 0149049 | 11/1984 | European Pat. Off. | |
| 0145357 | 11/1984 | European Pat. Off. | |
| 60-54398 | 9/1985 | Japan | 365/189 |

Primary Examiner—Stuart N. Hecker
Assistant Examiner—Alfonso Garcia
Attorney, Agent, or Firm—Staas & Halsey

[57] ABSTRACT

A memory device comprises an access circuit for setting a selected one of word lines to a low (or high) level responsive to a row address and for setting a selected one of bit lines to a high (or low) level responsive to a columnm address so as to designate a memory cell within a memory cell array, a comparing circuit driven by a constant current source for reading out information from the designated memory cell via the bit lines by comparing the bit line level with a reference level, an output circuit for outputting the information read out by the comparing circuit, and a control circuit for either setting all of the word lines and bit lines to a high level or setting all of the word lines and bit lines to have a high impedance and setting the impedance at an output of the output circuit to a high impedance when the memory device is disabled, so as to reduce the power consumption when the memory device is disabled.

12 Claims, 5 Drawing Sheets

Row Address Buffer Circuit 11

Column Address Buffer Circuit 42

Row Address Buffer Circuit 11

Column Address Buffer Circuit 42

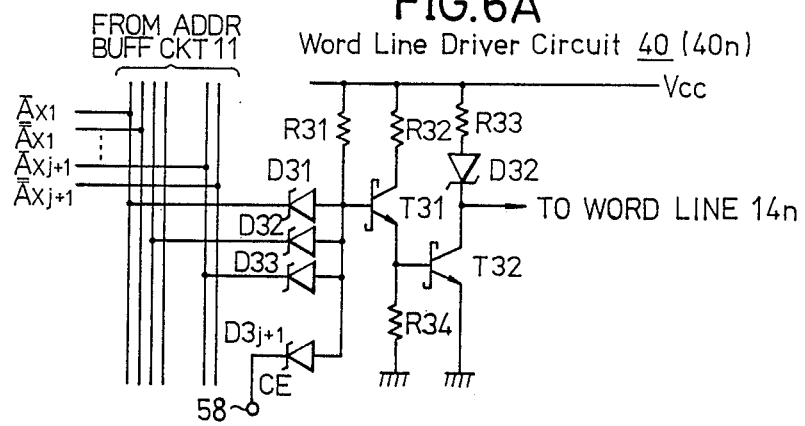
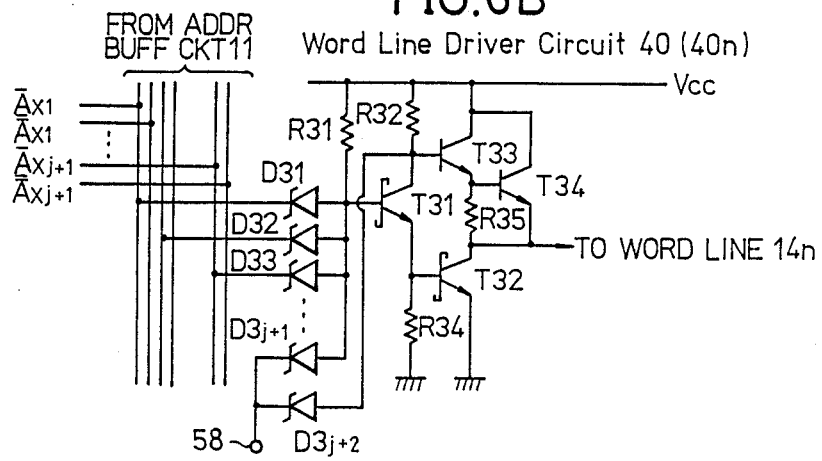
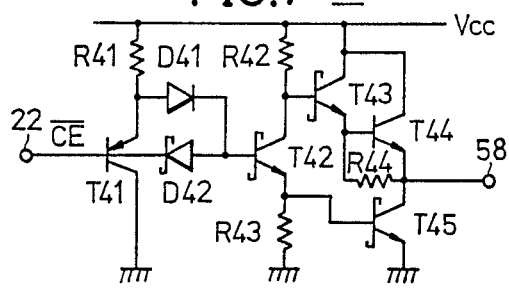

SEMICONDUCTIVE MEMORY DEVICE WITH CURRENT CONTROL AND COMPARISON MEANS TO REDUCE POWER CONSUMPTION AND INCREASE OPERATING SPEED

BACKGROUND OF THE INVENTION

The present invention generally relates to memory devices, and more particularly to a memory device which reads out stored information by comparing a bit line level with a reference level and either sets all of word lines and bit lines to a high level or sets all of the word lines and bit lines to have a high impedance so as to reduce the power consumption of the memory device when the memory device is disabled and no read-out operation is carried out.

As will be described later in conjunction with a drawing, a conventional read only memory device generally comprises a row address buffer circuit, a column address buffer circuit, a word line driver circuit, a bit line driver circuit, a memory cell array, a multiplexer circuit, and an output circuit. A row address is decoded in the row address buffer circuit, and the word line driver circuit drives word lines so as to select a word line by setting the selected word line to a high level. A column address is decoded in the column address buffer circuit, and the bit line driver circuit drives bit lines responsive to a decoded output of the column address buffer circuit so as to select a bit line by setting the level of the selected bit line to a low level.

The base of transistors constituting the multiplexer circuit are coupled to the bit lines, and stored information is read out from a selected memory cell in the memory cell array by selectively turning ON and turning OFF these transistors. An output signal of the multiplexer circuit is outputted via the output circuit.

A chip enable signal controls the output circuit to carry out an output operation, and a chip disable signal disables the output operation, that is, disables the memory device, by setting the impedance at the output of the output circuit to a high impedance.

In the conventional memory device, however, output signals of AND circuits constituting the bit line driver circuit all have a low level except for one output signal even when the memory device is disabled by the chip disable signal. For this reason, a current flows through all of the resistors in the multiplexer circuit that supplies a current to the bit lines from a power source terminal, except for one resistor. In this state, a large potential difference exists between the power source terminal and the AND circuits having the low-level outputs. Hence, there is a problem in that the power consumption of the memory device is large even when the memory device is disabled by the chip disable signal.

A semiconductor device generally comprises a plurality of memory devices such as read only memories (ROMs) and programmable read only memories (PROMs), and an arbitrary one of the memory devices is selected to read out desired information from the selected memory device when carrying out a certain task. Accordingly, it is desirable that the power consumption of the non-selected (or disabled) memory devices in the semiconductor device is small.

When the resistances of the resistors in the multiplexer circuit are increased so as to reduce the power consumption of the memory device, the read-out speed from the bit lines of the memory device becomes slow. On the other hand, when the supply of power from the power source terminal to the multiplexer circuit and to the output circuit is cut off when the memory device is disabled, it takes too long for the disabled memory device to reach the operating state when the disabled memory device is again enabled.

SUMMARY OF THE INVENTION

Accordingly, it is a general object of the present invention to provide a novel and useful memory device in which the problems described heretofore are eliminated.

Another and more specific object of the present invention is to provide a memory device comprising: access circuit means for setting a selected word line of the device to a low (or high) level responsive to a row address and for setting a selected bit line of the device to a high (or low) level responsive to a column address so as to designate a memory cell within a memory cell array by the row and column addresses; comparing circuit means driven by a constant current source for reading out stored information from a designated memory cell via the bit lines, by comparing the bit line level with a reference level; output circuit means for outputting the information read out by the comparing circuit means, and control circuit means for either setting all of the word lines and bit lines to a high level or setting all of the word lines and bit lines to have a high impedance and setting the impedance at an output of the output circuit means to a high impedance when the memory device is disabled. According to the memory device of the present invention, the current which would flow through all of the word lines and bit lines in the conventional memory device when the memory device is disabled will flow through the constant current source in the comparing circuit means of the memory device and not through all of the word lines and bit lines. The current which flows through the comparing circuit means when the memory device is disabled is limited by the constant current source which drives the comparing circuit means, and the power consumption of the disabled memory device is effectively reduced.

Other objects and further features of the present invention will be apparent from the following detailed description when read in conjunction with the accompanying drawings.

BRIEF DESCRIPTION OF THE DRAWINGS

FIGS. 6A and 6B respectively are circuit diagrams showing embodiments of a word line driver circuit within the circuit system shown in FIG. 3; and FIG. 7 is a circuit diagram showing an embodiment of an inverter within the circuit system shown in FIG. 3.

DETAILED DESCRIPTION OF THE PREFERRED EMBODIMENTS

Figure 1:
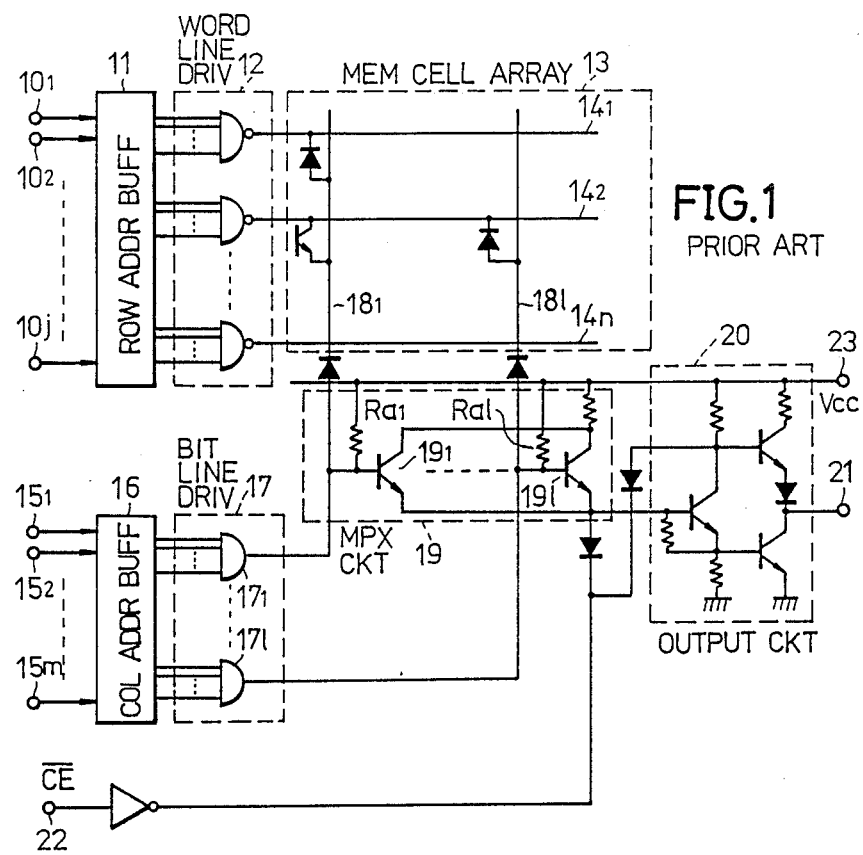
FIG. 1 is a system circuit diagram showing an essential part of an example of a conventional memory device.

FIG. 1 shows an example of a conventional read only memory device. This device generally comprises a row address buffer circuit 11, a word line driver circuit 12, a memory cell array 13, a column address buffer circuit 16, a bit line driver circuit 17, a multiplexer circuit 19, and an output circuit 20. A row address applied to terminals $10_1$ through $10_j$ is decoded in the row address buffer circuit 11, and the word line driver circuit 12 drives word lines $14_1$ through $14_n$ so as to select a word line by setting the selected word line to a low level, where $n = 2^j$. A column address applied to terminals $15_1$ through $15_m$ is decoded in the column address buffer circuit 16, and the bit line driver circuit 17 drives bit lines $18_1$ through $18_l$ responsive to a decoded output of the column address buffer circuit 16 so as to select a bit line by setting the level of the selected bit line to a high level, where $l = 2^m$.

Bases of transistors $19_1$ through $19_l$ constituting the multiplexer circuit 19 are coupled to the bit lines $18_1$ through $18_l$, and a stored information is read out from a selected memory cell in the memory cell array 13 by selectively turning ON and turning OFF these transistors $19_1$ through $19_l$. An output signal of the multiplexer circuit 19 is outputted via the output circuit 20.

A low-level chip disable signal $\overline{CE}$ controls the output circuit 20 to carry out an output operation, and a high-level chip disable signal $\overline{CE}$ from a terminal 22 disables the output operation, that is, disables the memory device, by setting the impedance at an output terminal 21 to a high impedance.

In the conventional memory device, however, output signals of AND circuits $17_1$ through $17_l$ constituting the bit line driver circuit 17 all have a low level except for one output signal even when the memory device is disabled by the chip disable signal $\overline{CE}$. For this reason, a current flows through all of resistors Ra1 through Ral in the multiplexer circuit 19 for supplying a current to the bit lines $18_1$ through $18_l$. More precisely, current flows to the AND circuits $17_1$ through $17_l$ via the bit lines $18_1$ through $18_l$, from a power source (Vcc) terminal 23 except for one resistor. A large potential difference exists between the power source terminal 23 and the AND circuits with the low-level outputs. Hence, there is a problem that the power consumption of the memory device is large even when the memory device is disabled by the chip disable signal $\overline{CE}$.

A semiconductor device generally comprises a plurality of memory devices such as ROMs and PROMs, and an arbitrary one of the memory devices is selected to read from when carrying out a certain task. Accordingly, it is desirable that the power consumption of the non-selected (or disabled) memory devices in the semiconductor device be small.

When the resistances of the resistors Ra1 through Ral in the multiplexer circuit 19 are increased so as to reduce the power consumption of the memory device, the read-out speed from the bit lines $18_1$ through $18_l$ of the memory device becomes slow. On the other hand, when the supply of power from the power source terminal 23 to the multiplexer circuit 19 and to the output circuit 20 is cut off when the memory device is disabled, it takes too long for the disabled memory device to reach an operating state after the disabled memory device is again enabled.

The present invention eliminates the problems of the conventional memory device by either setting all of the word lines and bit lines to a high level or setting all of the word lines and bit lines to have a high impedance and setting the impedance at an output of the output circuit to a high impedance when the memory device is disabled.

Figure 2:
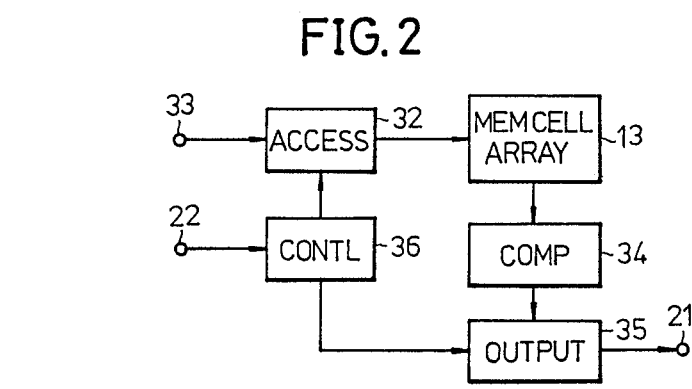
FIG. 2 is a system block diagram illustrating the operating principle of the memory device according to the present invention.

FIG. 2 shows a system block diagram for explaining the operating principle of the memory device according to the present invention. The memory device comprises an access circuit means 32 for setting a selected one of the word lines to a low (or high) level responsive to a row address from a terminal means 33 and for setting a selected one of the bit lines to a high (or low) level responsive to a column address from the terminal means 33 so as to designate a memory cell within a memory cell array 13 by the row and column addresses; a comparing circuit means 34 driven by a constant current source (not shown) for reading out stored information from a designated memory cell via the bit lines by comparing the bit line level with a reference level; an output circuit means 35 for outputting the information read out by the comparing circuit means 34; and a control circuit means 36 for either setting all of the word lines and bit lines to a high level or setting all of the word lines and bit lines to have a high impedance and setting the impedance at the output terminal 21 to a high impedance when the memory device is disabled by a chip disable signal from the terminal 22. According to the memory device of the present invention, the current which would flow through all of the word lines and bit lines in the conventional memory device shown in FIG. 1 even when the memory device is disabled will flow through the comparing circuit means 34 of the memory device, and not through all of the word lines and bit lines. The current which flows through the comparing circuit means 34 when the memory device is disabled is limited by the constant current source which drives the comparing circuit means 34, and the power consumption of the disabled memory device is effectively reduced.

Figure 3:
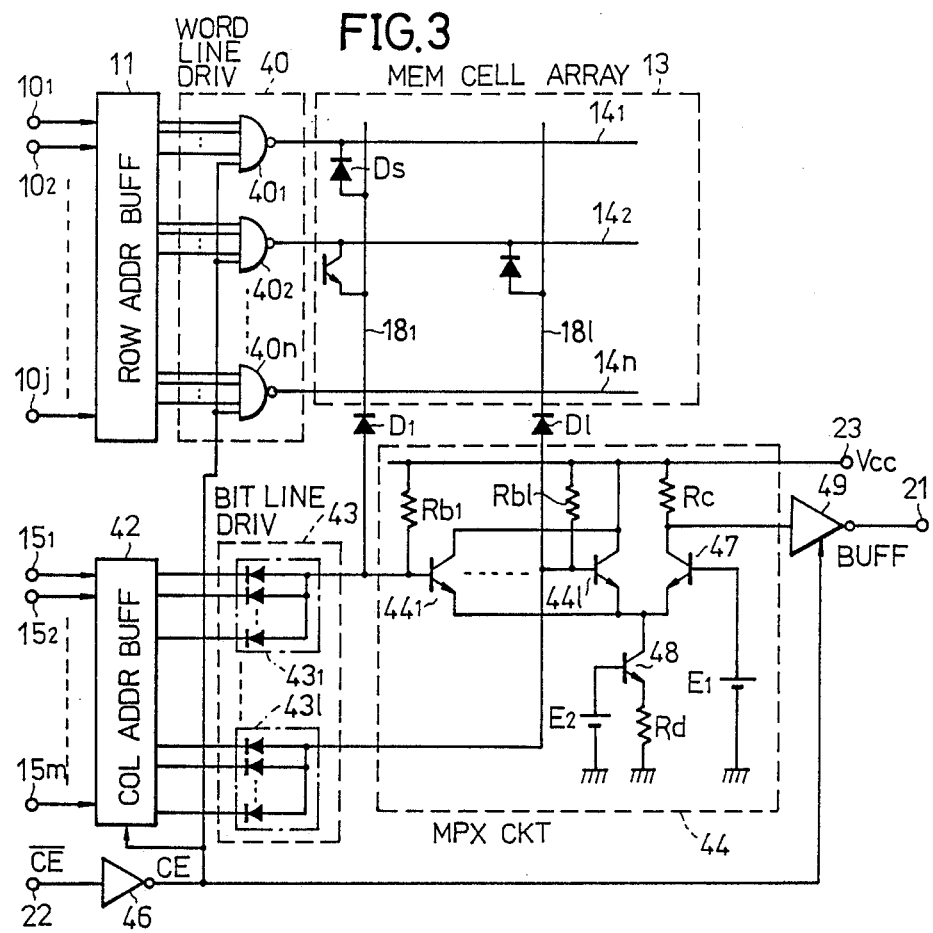
FIG. 3 is a system circuit diagram showing a part of an embodiment of the memory device according to the present invention.
Figure 4A:
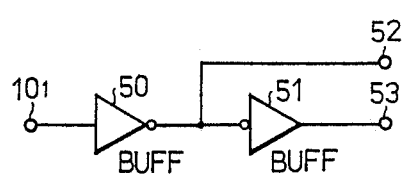
FIGS. 4A and 4B are system circuit diagrams respectively showing parts of embodiments of a row address buffer circuit and a column address buffer circuit within the circuit system shown in FIG. 3.

FIG. 3 shows an embodiment of the memory device according to the present invention. In FIG. 3, those parts which are the same as those corresponding parts in FIG. 1 are designated by the same reference numerals, and description thereof will be omitted. In FIG. 3, the row address buffer circuit 11 comprises a series circuit constituted by two buffers coupled in series, with respect to each of the row address bits. FIG. 4A shows a part of an embodiment of the row address buffer circuit 11. One row address bit from the terminal $10_1$ is inverted in a buffer 50 and is obtained from a terminal 52. The output signal of the buffer 50 is inverted in a buffer 51 and is obtained from a terminal 53. As a result, 2j bits of signals are outputted from the row address buffer circuit 11 and are supplied to a word line driver circuit 40.

Figure 5A:
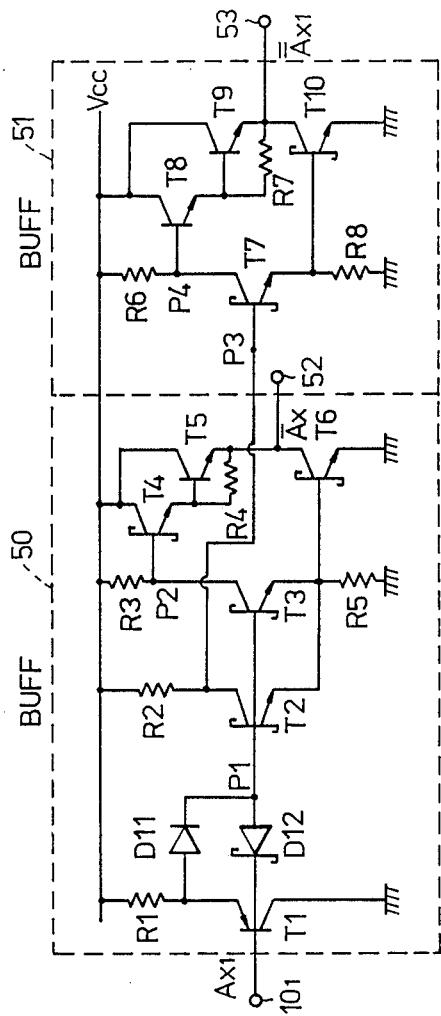
FIGS. 5A and 5B are circuit diagrams showing embodiments of the circuit construction of the circuit systems shown in FIGS. 4A and 4B.

FIG. 5A shows a circuit construction of the row address buffer circuit 11 shown in FIG. 4A. In FIG. 5A, the buffer 50 comprises transistors T1 through T6, diodes D11 and D12, and resistors R1 through R5 which are connected as shown. The buffer 51 comprises transistors T7 through T10 and resistors R6 through R8 which are connected as shown.

Referring to FIG. 3, the word line driver circuit 40 comprises n NAND circuits $40_1$ through $40_n$ supplied with the output signals of the row address buffer circuit 11, and outputs of the NAND circuits $40_1$ through $40_n$ are coupled to corresponding ones of the word lines $14_1$ through $14_n$. A chip enable signal CE is obtained from an inverter 46 which inverts a chip disable signal $\overline{CE}$ from the terminal 22, and this chip enable signal CE is supplied to each of the NAND circuits $40_1$ through $40_n$. Accordingly, when the chip enable signal CE has a high level, one of the NAND circuits $40_1$ through $40_n$ outputs a low-level signal depending on the row address. On the other hand, all of the NAND circuits $40_1$ through $40_n$ output a high-level signal when the chip enable signal CE has a low level.

FIG. 6A shows a part of an embodiment of the word line driver circuit 40. The NAND circuit $40_n$ comprises resistors R31 through R33, diodes D31 through $D3_{j+1}$, and transistors T31 and T32 which are connected as shown. The diodes $D3_1$ through $D3_j$ are supplied with inverted row address bits from, for example, the row address buffer circuit 11, and the diode $D3_{j+1}$ is supplied with the chip enable signal CE from the inverter 46. The output signal of the NAND circuit $40_n$ is obtained from a connection point of the diode D32 and the transistor T32. In the operation, when the chip enable signal CE is a low level, during the chip disable period, the diode $D3_{j+1}$ is in an ON state so that the transistors T31 and T32 are in the OFF state and the output becomes a high level.

Figure 4B:
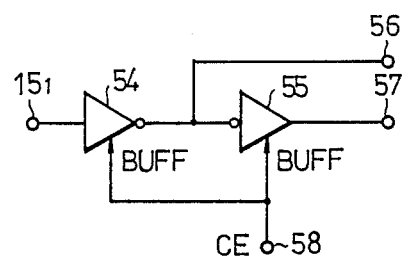

Referring to FIG. 3, a column address buffer circuit 42 comprises a series circuit constituted by two buffers coupled in series, with respect to each of the column address bits. FIG. 4B shows a part of an embodiment of the column address buffer circuit 42. One column address bit from the terminal $15_1$ is inverted in a tri-state buffer 54 and is obtained from a terminal 56. The output signal of the buffer 54 is inverted in a tri-state buffer 55 and is obtained from a terminal 57. In addition, the chip enable signal CE from the inverter 46 is supplied to the buffers 54 and 55 via a terminal 58. The buffers 54 and 55 carry out the inverting operation during a high-level period of the chip enable signal CE, and the terminals 56 and 57 are set to a high impedance during a low-level period of the chip enable signal CE. As a results, 2m bits comprising inverted column address signals, and the twice inverted column address signals, are outputted from the column address buffer circuit 42 and are supplied to a bit line driver circuit 43 in the same manner as the word line driver circuit 40 in FIG. 6A.

Figure 5B:
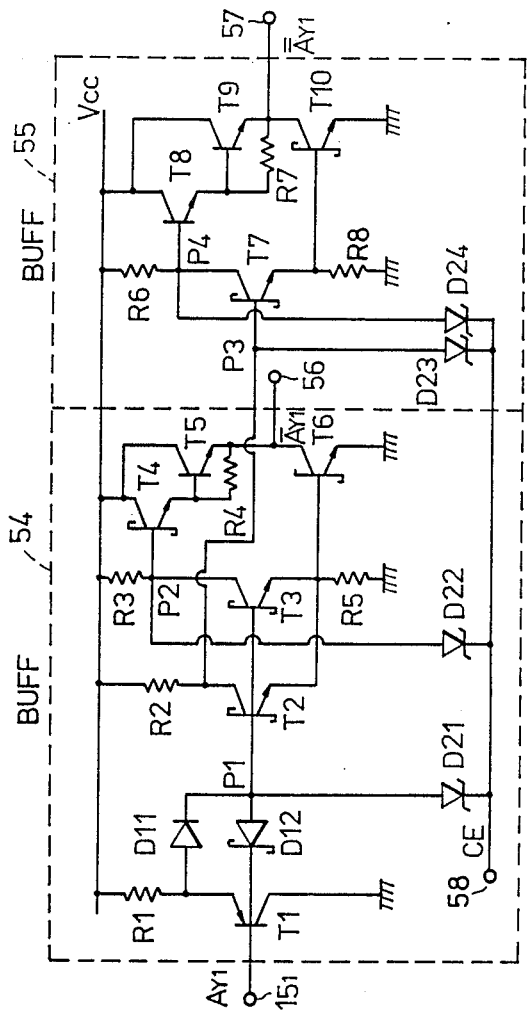

FIG. 5B shows the circuit construction of the column address buffer circuit 42 shown in FIG. 4B. In FIG. 5B, those parts which are the same as those corresponding parts in FIG. 5A are designated by the same reference numerals, and description thereof will be omitted. In FIG. 5B, the tri-state buffer 54 comprises transistors T1 through T6, diodes D11 and D12, resistors R1 through R5 and diodes D21 and D22 which are connected as shown. The tri-state buffer 55 comprises transistors T7 through T10, resistors R6 through R8, and diodes D23 and D24 which are connected as shown. Diode D21 is coupled between the output of the inverter 46 (connected to terminal 58) and a connection point P1 of the diodes D11 and D12 and the transistor T2. The diode D22 is coupled between the output of the inverter 46 and a connection point P2 of the resistor R3 and the transistors T3 and T4. The diode D23 is coupled between the output of the inverter 46 and a connection point P3 of the transistors T2 and T7. The diode D24 is coupled between the output of the inverter 46 and a connection point P4 of the resistor R6 and the transistors T7 and T8. In the operation of the column address buffer circuit 42 shown in FIG. 5B, when the chip enable signal CE is a low level (i.e., during the chip disable period), the level of the connection points (nodes) P1 through P4 becomes low level so that the transistors T2 through T10 are turned OFF, making terminals 56 and 57 high impedance.

The bit line driver circuit 43 (FIG. 3) comprises AND circuits $43_1$ through $43_l$ which receive output signals from the column address buffer circuit 42, and outputs of the AND circuits $43_1$ through $43_l$ are coupled to corresponding ones of the bit lines $18_1$ through $18_l$. The AND circuits $43_1$ through $43_l$ respectively have a diode logic structure, and diodes of the AND circuits $43_1$ through $43_l$ are supplied with the output signals of the column address buffer circuit 42. One of the AND circuits $43_1$ through $43_l$ outputs a high-level signal depending on the column address, and output signals of the AND circuits $43_1$ through $43_l$ are supplied to the corresponding bit lines $18_1$ through $18_l$ via diodes D1 through Dl. The row and column address buffer circuits 11 and 42, the word line driver circuit 40, and the bit line driver circuit 43 comprise an access circuit means 32 shown in FIG. 2.

Anodes of the diodes D1 through Dl are coupled to respective bases of transistors $44_1$ through $44_l$ and to one end of respective resistors Rb1 through Rbl for supplying the current from the power source Vcc. The transistors $44_1$ through $44_l$ and the resistors Rb1 through Rbl comprise multiplexer circuit 44 together, transistors 47 and 48, voltage sources E1 and E2 and resistors Rc and Rd. This multiplexer circuit 44 comprise comparing circuit means 34 shown in FIG. 2. The other ends of the resistors Rb1 through Rbl are coupled to the power source terminal 23. An emitter of the transistor 47 is coupled in common to emitters of all of the transistors $44_1$ through $44_l$. The power source voltage Vcc from the terminal 23 is supplied to a collector of the transistor 47 via the resistor Rc, and a reference voltage from the voltage source E1 is supplied to a base of the transistor 47. Transistors $44_1$ through $44_l$ and transistor 47 comprise a current switch.

The emitters of the transistors $44_1$ through $44_l$ and 47 are also coupled to a collector of the transistor 48 which is used as a constant current source. An emitter of the transistor 48 is grounded via the resistor Rd, and a constant voltage from the voltage source E2 is supplied to a base of the transistor 48. The constant current source supplies an operating circuit to the current switch.

The output signal of the multiplexer circuit 44 is obtained from the collector of the transistor 47, and is outputted from the terminal 21 via a tri-state buffer 49. This tri-state buffer 49 comprise output circuit means 35 shown in FIG. 2.

An inverted chip enable signal (chip disable signal) $\overline{CE}$ is applied to the terminal 22 and is inverted into the chip enable signal CE by the inverter 46 which comprises the control circuit means 36 shown in FIG. 2. This chip enable signal CE is supplied to the word line driver circuit 40, the column address buffer circuit 42 and the tri-state buffer 47.

FIG. 7 illustrates an embodiment of the inverter 46. The inverter 46 comprises resistors R41 through R44, diodes D41 and D42, and transistors T41 through T45 which are connected as shown. The output signal of the inverter 46 is obtained from a connection point of the resistor R44 and the transistors T44 and T45.

The tri-state buffer 49 performs an inverting operation during a high-level period of the chip enable signal CE, and sets the impedance at the terminal 21 to a high impedance during a low-level period of the chip enable signal CE.

In the case where the inverted chip enable signal $\overline{CE}$ is a low level, the output chip enable signal CE of the inverter 46 has a high level, and the memory device shown in FIG. 3 is enabled.

If the memory device is enabled, only the NAND circuit $40_1$ outputs a low-level signal and only the AND circuit $43_1$ outputs a high-level signal, then the signal level at the base of the transistor $44_1$ in the multiplexer circuit 44 is low. This is because the word line $14_1$ and the bit line $18_1$ are coupled by the memory cell (written with an information "1") which acts as a diode Ds. On the other hand, since the AND circuits $43_2$ through $43_l$ output low-level signals, the signal levels at the bases of the transistors $43_2$ through $43_l$ in the multiplexer circuit 44 are also low. Accordingly, the transistor 47 is turned ON and the output signal level of the multiplexer circuit 43 is low, and a high-level signal (information read out from the memory cell array 13) is obtained from the terminal 21.

On the other hand, when only the NAND circuit $40_2$ outputs a low-level signal and only the AND circuit $43_1$ outputs a high-level signal, only the signal level at the base of the transistor $44_1$ in the multiplexer circuit 44 is high. This is because the word line $14_2$ and the bit line $18_1$ are coupled by the memory cell (not written with information and thus containing information "0p38 ) which acts as a transistor and not a diode. Hence, the transistor $44_1$ is turned ON and the transistor 47 is turned OFF, and the output signal level of the multiplexer circuit 44 is high. As a result, a low-level signal (information read out from the memory cell array 13) is obtained from the terminal 21.

Next, in the case where the inverted chip enable signal $\overline{CE}$ has a high level, the low-level chip enable signal CE from the inverter 46 is supplied to the word line driver circuit 40, the column address buffer circuit 42 and the tri-state buffer 49. Since the impedance at the output of the tri-state buffer 49 is a high impedance, the memory device shown in FIG. 3 is disabled.

All of the NAND circuits $40_1$ through $40_n$ of the word line driver circuit 40 output a high-level signal responsive to the low-level chip enable signal CE, and the impedance of all of the tri-state buffers within the column address buffer circuit 42 have a high impedance. Accordingly, the signal levels at the bases of the transistors $44_1$ through $44_l$ in the multiplexer circuit 44 are high, and all of the transistors $44_1$ through $44_l$ are turned ON.

In this state, the total emitter current of the transistors $44_1$ through $44_l$ is maintained at a constant value by the constant current source, transistor 48. In addition, of the transistors $44_1$ through $44_l$ emitter currents, only an extremely small portion corresponds to the currents supplied from the resistors Rb1 through Rbl to the bases of the transistors $44_1$ through $44_l$ as base currents. For this reason, the power consumed by the resistors Rb1 through Rbl in the disabled memory device is extremely small.

In the embodiment described heretofore, all of the word lines and bit lines are set to have a high impedance and the output of the output circuit is set to have a high impedance when the memory device is disabled. However, it is possible to obtain the same effects by setting all of the word lines and bit lines to have a high level and setting the impedance at the output of the output circuit to a high impedance. For example, the bit line may be set to have a high level by omitting the diodes D22 and D24 in FIG. 5B. In this case, where the chip enable signal CE is low level, only the transistors T2, T3, T6, T7 and T10 are OFF state and the transistors T4, T5, T8 and T9 are ON state.

FIG. 6B shows another embodiment of the word line driver circuit 40 which has an off buffer circuit that provides a high impedance state. In FIG. 6B, those parts which are the same as those corresponding parts in FIG. 6A are designated by the same reference numerals, and description thereof will be omitted. The off buffer circuit comprises transistors T33 and T34 and a resistor R35, and the off buffer circuit is put into the OFF state by a diode $D3_{j+2}$.

As described heretofore, the present invention greatly reduces the power consumption of a disabled memory device because the current is limited by a constant current source in a comparing circuit means.

The present invention is not limited to these embodiments, but various variations and modifications may be made without departing from the scope of the present invention.

What is claimed is:

1. A memory device having an enable state and a disable state, comprising:
   word lines;
   bit lines;
   a memory cell array comprising a plurality of memory cells in a matrix arrangement, said plurality of memory cells being coupled to corresponding ones of said word lines and said bit lines;
   input terminal means for receiving row address signals and column address signals;
   access circuit means for setting a selected one of the word lines to a first level responsive to the row address signals and for setting a selected one of the bit lines to a second level responsive to the column address signals so as to designate one of said plurality of memory cells within said memory cell array;
   constant current source means for maintaining a current;
   comparing circuit means, operatively connected to said constant current source means and to said bit lines, for receiving a reference level and for reading information from said designated memory cell via the bit lines by comparing a bit line level of the bit line coupled to said designated memory cell with said reference level;
   output circuit means, having an output impedance, for outputting the information read out by the comparing circuit means; and
   control circuit means, operatively connected to receive a disable signal, for setting all word lines and all bit lines to one of a high impedance and for high level, and for setting the impedance of said output circuit means to a high impedance when the memory device is placed in the disable state by said disable signal.

2. A memory device as claimed in claim 1 wherein said access circuit means comprises:
   row address buffer circuit means for receiving and decoding the row address signals;
   word line driver circuit means for receiving said decoded row address signals and said disable signal, and for setting said selected one of the word lines to the first level;

column address buffer circuit means for receiving and decoding the column address signals and in response to said disable signal; and bit line driver circuit means for receiving said column address signals and for setting said selected one of the bit lines to the second level, said first level being a low level and said second level being a high level.

3. A memory device as claimed in claim 2, wherein said word line driver circuit means comprises:

a plurality of NAND circuits, respectively connected to receive a corresponding one of said decoded row address signals and to receive said disable signal, each of said NAND circuits having an output operatively connected to a corresponding one of said plurality of word lines.

4. A memory device as claimed in claim 2 wherein said disable signal has high level periods and low level periods, and wherein said column address buffer circuit means comprises:

first tri-state buffer means, operatively connected to receive the column address signals and said disable signal and having a first output, for inverting said column address signals and providing said inverted column address signals at said first output during the low-level period of said disable signal and for placing said first output in a high impedance state during the high-level period of said disable signal;

second tri-state buffer means, operatively connected to said first output of said first tri-state means and to receive said disable signal and having a second output, for inverting signals provided by said first output, for providing these inverted signals during the low-level of said disable signal and for placing said second output in a high impedance state during the high-level of said disable signal, said bit line driver circuit means being operatively connected to receive said first output signal and said second output signals.

5. A memory device as claimed in claim 1 wherein said comparing circuit means includes means for restricting a current from flowing through the word lines and the bit lines when the memory device is disabled and for enabling a current to flow through said comparing circuit means when the memory device is enabled, said current being limited by said constant current source means.

6. A memory device as claimed in claim 1 wherein said comparing circuit means comprises:

a plurality of resistors;

a plurality of first transistors having bases coupled to corresponding ones of said plurality of bit lines and operatively connected to receive a power source voltage via respective ones of said resistors, said first transistors having collectors coupled in common and having emitters coupled in common;

a second transistor having a collector operatively connected to receive the power source voltage one of said resistors and having a base operatively connected to receive said reference level, and wherein said constant current circuit means is operatively connected to the emitters of said first and second transistors so as to limit emitter currents of said first transistors to a constant value, and said output circuit means is operatively connected to receive the information read out by said comparing circuit means from the collector of said second transistor.

7. A memory device as claimed in claim 1 wherein said output circuit means comprises a tri-state buffer means, operatively connected to receive said disable signal and having an output, for inverting the information read out by said comparing circuit means during a low-level period of said disable signal and for placing said output of said tri-state buffer in a high impedance state during a high-level period of said disable signal.

8. A memory device as claimed in claim 1 wherein said control means comprises an inverter means operatively connected to receive said disable signal, for inverting said disable signal and for providing said inverted disable signal to said access circuit means and to said output circuit means.

9. A memory device having an enable state and a disable state, comprising:

word lines;

bit lines;

a memory cell array comprising a plurality of memory cells in a matrix arrangement, said plurality of memory cells being coupled to corresponding ones of said word lines and said bit lines;

input terminal means for receiving row address signals and column address signals so as to designate a memory cell within said memory cell array;

access circuit means for setting a selected one of the word lines to a first level responsive to the row address signals and for setting a selected one of the bit lines to a second level responsive to the column address signals so as to designate one of said plurality of memory cells within said memory cell array;

constant current source means for maintaining a current;

comparing circuit means, operatively connected to said constant current source means and to said bit lines, for receiving a reference level and for reading out information from said designated memory cell via the bit lines by comparing a bit line level of the bit line corresponding to said designated memory cell with said reference level;

output circuit means, having an output impedance, for outputting the information read out by the comparing circuit means; and control circuit means, operatively connected to said bit lines and to receive a disable signal for setting all word lines and all bit lines to a high level and setting the impedance of said output circuit means to a high impedance when the memory device is placed in the disable state by said disable signal.

10. A memory device having an enable state and a disable state, comprising:

word lines;

bit lines;

a memory cell array comprising a plurality of memory cells in a matrix arrangement, said plurality of memory cells being coupled to said corresponding ones of said word lines and said bit lines;

input terminal means for receiving row address signals and column address signals so as to designate a memory cell within said memory cell array;

access circuit means for setting a selected one of the word lines to a first level responsive to the row address signals and for setting a selected one of the bit lines to a second level responsive to the column address signals so as to designate one of said plurality of memory cells within said memory cell array;

constant current source means for maintaining a current;

comparing circuit means, operatively connected to said constant current source means and to said bit lines, for receiving a reference level and for reading out information from said designated memory cell via the bit lines by comparing a bit line level of the bit line corresponding to said designated memory cell with said reference level;

output circuit means, having an output impedance, for outputting the information read out by the comparing circuit means; and control circuit means, operatively connected to said bit lines and to receive a disable signal for setting all word lines to a high level, for setting all of the bit lines to a high impedance and for setting the impedance of said output circuit means to a high impedance when the memory device is placed in the disable state by said disable signal.

11. A memory device having an enable state and a disable state, comprising:

word lines;

bit lines;

a memory cell array comprising a plurality of memory cells in a matrix arrangement, said plurality of memory cells being coupled to corresponding ones of said word lines and said bit lines;

input terminal means for receiving row address signals and column address signals so as to designate a memory cell within said memory cell array;

access circuit means for setting a selected one of the word lines to a first level responsive to the row address signals and for setting a selected one of the bit lines to a second level responsive to the column address signals so as to designate one of said plurality of memory cells within said memory cell array;

constant current source means for maintaining a current;

comparing circuit means, operatively connected to said constant current source means and to said bit lines, for receiving a reference level and for reading out information from said designated memory cell via the bit lines by comparing a bit line level of the bit line corresponding to said designated memory cell with said reference level;

output circuit means, having an output impedance, for outputting the information read out by the comparing circuit means; and control circuit means, operatively connected to said bit lines and to receive a disable signal for setting all word lines to have a high impedance, for setting all of the bit lines to a high level and for setting the impedance of said output circuit means to a high impedance when the memory device is placed in the disable state by said disable signal.

12. A memory device having an enable state and a disable state, comprising:

word lines;

bit lines;

a memory cell array comprising a plurality of memory cells operatively connected to corresponding ones of said word lines and said bit lines;

row address buffer means, having a plurality of row outputs respectively connected to corresponding ones of said bit lines, for receiving row address signals and for providing row select signals as said row outputs;

column address buffer means, having a plurality of column outputs respectively connected to corresponding ones of said word lines, for receiving column address signals and for providing column select signals as said column outputs;

constant current source means for maintaining a current;

comparing circuit means having a plurality of input terminals, each connected to a corresponding one of said bit lines for receiving a reference level, for reading information from a memory cell via a bit line by comparing a bit line level with said reference level;

output circuit means, having an output impedance, for outputting information read by said comparing circuit means; and control circuit means, operatively connected to receive a disable signal, for setting all of the word lines and all of the bit lines to one of a high impedance and a high level, and for setting the impedance of said output circuit means to a high impedance when the memory device is placed in the disable state by said disable signals so as to restrict a current flowing through said word lines and said bit lines when the memory device is in the disable state.

* * * * *